(12) United States Patent
Ito et al.

(10) Patent No.: US 6,378,983 B1
(45) Date of Patent: Apr. 30, 2002

(54) DIGITAL PREPRESS SYSTEM

(75) Inventors: Shinichi Ito; Kazuhisa Nakao; Kozi Tokunaga, all of Tokyo (JP)

(73) Assignee: Mitsubishi Paper Mills, Limited, Tokyo (JP)

( * ) Notice: Subject to any disclaimer, the term of this patent is extended or adjusted under 35 U.S.C. 154(b) by 0 days.

(21) Appl. No.: 09/644,297

(22) Filed: Aug. 23, 2000

(30) Foreign Application Priority Data

Aug. 25, 1999 (JP) ............................................ 11-237913
Aug. 3, 2000 (JP) ...................................... 2000-235416

(51) Int. Cl.$^7$ ................................ B41J 2/01; B41J 2/21
(52) U.S. Cl. .......................... 347/43; 347/101; 347/105
(58) Field of Search .......................... 347/43, 101, 105, 347/106; 428/341

(56) References Cited

U.S. PATENT DOCUMENTS 6,203,899 B1 * 3/2001 Hirose et al. ................ 428/341

FOREIGN PATENT DOCUMENTS

| JP | 8-99459 | 4/1996 |
| JP | 8-207422 | 8/1996 |

OTHER PUBLICATIONS

Partial translation of Japan Printer, published on Apr. 15, 1999.

\* cited by examiner

*Primary Examiner*—Thinh Nguyen
(74) *Attorney, Agent, or Firm*—Armstrong, Westerman & Hattori, LLP (57) ABSTRACT

A digital prepress system capable of preparing an excellent proof sheet free from the wrong conversion of characters and double procedure of trapping processing, having little color difference of images between the proof sheet and the regular printed matters and imparting no impression that proofreading paper and regular printing paper are different in the color tone, feeling of gloss and the like. This invention provides a digital prepress system wherein digital data are processed on a unit of Raster image processor and data obtained therefrom are transferred to a planographic print output unit and an ink jet printer to generate a planographic print and a proof sheet respectively, said ink jet printer includes a device for preparing said proof sheet to make ink jet recording on a proofreading paper having a color difference of 2 or less and a gloss difference of 75° specular gloss in an absolute value of 15 or less as compared with regular printing paper according to the provisions of JIS Z8730, with the basis weight different from that of regular printing paper by a range between −10 to +50%.

9 Claims, 4 Drawing Sheets

DIGITAL PREPRESS SYSTEM

BACKGROUND OF THE INVENTION

The present invention relates to a digital prepress system for the purpose of obtaining a good proof sheet.

Conventionally, the printing industry has gone ahead with digitizing the plate-making process and that of preparing the proof sheets by the name of a digital prepress. The digital prepress process comprises a general purpose computer preparing digital data page by page, making an intermediate film or directly a planographic print on the basis of the so obtained digital data. Of these processes, digital prepress systems comprising the general purpose computer preparing the digital data page by page and outputting the planographic prints directly on the basis of the so obtained digital data have started to spread in the industry.

Figure 1:
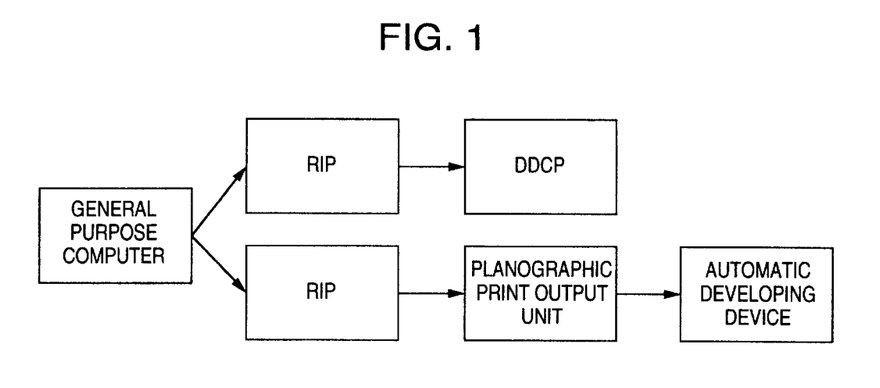
FIG. 1 is a diagram illustrating a conventional digital prepress system.

A conventional digital prepress system has had a general purpose computer as the main body, connected with a planographic print preparing system comprising a RIP (Raster Image Processor), a planographic print output unit and an automatic developing device and a proof sheet preparing system comprising a RIP and a DDCP (Direct Digital Color Proofer), as illustrated in FIG. 1. Since the conventional digital prepress system uses two units of RIP, it has been liable to give rise to the wrong conversion of characters and a double procedure of trapping processing with the result that the finish of regular printed matters is different from that of proof sheets, far from the sufficiently satisfactory proofreading. The digital data are prepared in two byte fonts assigned to them by the general purpose computer, and ordinarily the assigned two byte fonts are selected for use from among those incorporated in the RIPs. Therefore, if the two byte fonts unincorporated in either RIP are used, the wrong conversion of characters or errors occur when the digital data are converted by the RIPs and it has been necessary for the conventional digital prepress systems to have the fonts corresponding to each of the RIPs.

The trapping processing means a processing at a step of printing one image lapped on another wherein either one of the lapped images is made a little larger than the other one to prevent the white ground of paper from appearing on a clearance between the lapped images on account of the deviation of registration upon printing or the expansion or contraction of regular printing paper, and this processing is performed by the software to prepare the digital data or the RIPs but how to process is different depending upon the setting of RIPs. Furthermore, the proof sheets prepared by the DDCP have the color reproduction region different from and narrower than that of the regular printed matters and furthermore the conventional DDCPs have another problem that the recording chart used therein is found to be unsatisfactory for use in proofreading because the recording chart is different from regular printing paper in the color tone, gloss and feel of touch.

SUMMARY OF THE INVENTION

An object of the present invention is to find a solution in the conventional problems as described above and to provide a digital prepress system capable of preparing economically at a low cost an excellent proof sheet unsusceptible to the wrong conversion of characters and a double procedure of trapping processing, having little difference of the images between the regular printed matters and proof sheets with a mutual close likeness of their color reproduction regions and imparting no impression that proofreading paper is different from regular printing paper in color tone, gloss, touch and the like.

The above problems have found a solution with a digital prepress system wherein digital data are processed on a unit of Raster image processor and the so obtained bit data are transferred to a planographic print output unit and an ink jet printer to obtain a planographic print and a proof sheet respectively, said ink jet printer comprising a means for preparing said proof sheets with an arrangement to make ink jet recording on proofreading paper having a color difference of 2 or less and a difference of 75° specular gloss in an absolute value of 15 or less as provided for by JIS Z8730 in comparison with regular printing paper.

The ink jet recording is made preferably with compensating the difference of color reproduction regions between a regular printed matter and a proof sheet using said proofreading paper.

The basis weight of said proofreading paper is preferably different from that of regular printing paper by −10% or more to +50% or less.

Said proofreading paper is preferably coated paper comprising one or more ink-receiving layers containing a porous pigment on the top of a support.

Said ink jet printer records preferably by using ink comprising 6 colors or more.

DETAILED DESCRIPTION OF THE INVENTION

Figure 2:
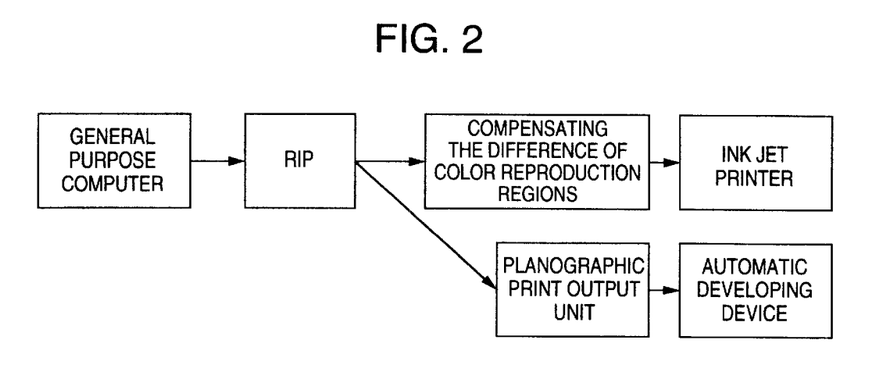
FIG. 2 is a diagram illustrating a digital prepress system of the present invention.

The digital prepress system of the present invention is a system comprising a general purpose computer and a unit of RIP as the main body, connected with an ink jet printer, a planographic print output unit and an automatic developing device, as illustrated in FIG. 2. It is desirable to have an ink jet printer capable of recording in ink of 4 colors or more, preferably ink of 6 colors or more.

The RIP for use in the present invention is a device converting the digital data prepared by the general purpose computer into the digital data suitable for outputting by the planographic print output unit and the ink jet printer, having the main function of converting the data including all of images, characters and graphics described in the page description language into the bit data and sometimes the function of plate-making processing as well. Furthermore, the capacity of the digital data described in the page description language is decreased by making reference to the description of the two byte fonts in the page description language, extracting the outline data from the two byte fonts previously incorporated into the auxiliary memory unit of RIP and converting these outline data into the bit data. It is particularly desirable that the RIP for use in the present invention has the function of converting the digital data prepared by the general purpose computer into the TIFF (Tagged Image File Format) bit data having general purpose properties in consideration of the setup that the RIP operates with multiple models of ink jet printer to output. As illustrated in FIG. 2, the ink jet printer outputs the data for use in the preparation of regular printed matters after the RIP. At this point it is preferable to make the ink jet recording after the difference of color reproduction regions is compensated between the regular printed matters and the proof sheets using said proofreading paper.

Figure 3:
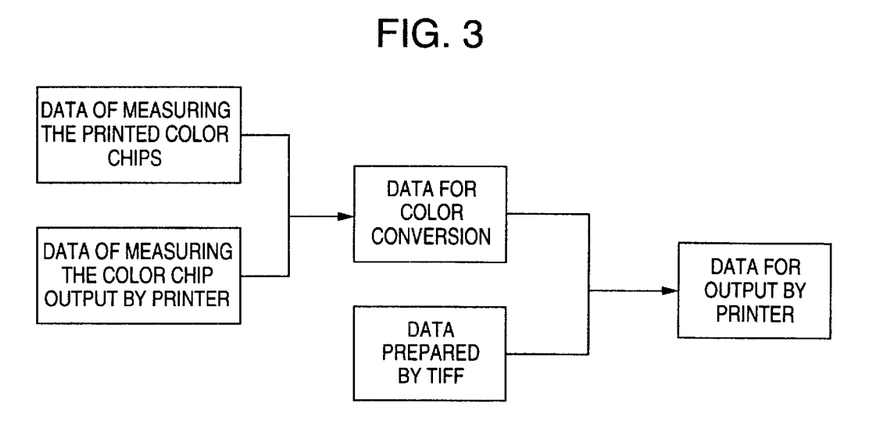
FIG. 3 is a diagram illustrating how to compensate the difference of color reproduction regions.

FIG. 3 is a diagram illustrating the content of the process for compensating the color reproduction regions according to FIG. 2. Color chips comprising second and third colors prepared by mixing C (cyan), M (magenta), Y (yellow) and K (black) singly or in combination of these four colors are printed and are put on the ink jet recording and their colors are measured. In both the regular printed matters and ink jet records, the colors are measured preferably in consideration of the changes of color with time. Furthermore, the proof sheets having little color difference of images can be obtained by preparing the data for color conversion on the basis of the results of said color measurement, adding the data for color conversion to the TIFF data prepared by the RIP, putting them on ink jet recording and thus compensating the difference of the color reproduction region from that of the regular printed matters.

In the present invention, the same RIP deals with the preparation of both the planographic prints and proof sheets, giving rise to no wrong conversion of characters and no double procedure of plate-making processing such as trapping processing on account of two different RIPs, and thus the good proof sheets are obtained. If the two byte fonts unincorporated into RIPs are assigned to prepare the digital data, they are replaced on the printings and proof sheets by the fonts within the RIPs other than the assigned two byte fonts, giving rise to a phenomenon of wrong conversion of characters that a great many Japanese characters of two byte fonts are replaced by alphabets or symbols, but this problem can find a solution with the purchase of only one assortment of fonts, permitting a digital prepress system to be built economically at a low cost. Furthermore, the RIP and general purpose computer desirably have as fast processing speed and as great storage capacity as possible.

In the present invention, any of the methods of silver salt type, photopolymer type or thermal type is good to form the images in the planographic print, and either of the support made of aluminum or film can be used, ensuring stable quality of the regular printed matters.

The ink jet printer is a printer system wherein the printings are made and the images are formed on a recording chart by spraying ink of three colors such as C (cyan), M (magenta) and Y (yellow) or four colors with an addition of K (black) from a nozzle on the printer head, and some printers have a mechanism of regulating ink particles with electrical voltage or some printers regulate them by taking advantage of pressure of bubbles developed by heating. The present invention uses the ink jet printer capable of making the ink jet recording of six colors or more with the addition of Light Cyan, Light Magenta and the like to said C, M, Y and K or six colors or more with the addition of Photo Black, Photo Magenta, Photo Cyan and the like to said C, M and Y to provide the color reproduction region wider than that of conventional DDCP with the result that the proof sheets having a greater likeness to the regular printed matters can be obtained by compensating the difference of their color reproduction regions. Furthermore, it is desirable to process the TIFF bit data prepared by RIP with the color conversion software to create the data including the description of color conversion and process them. Moreover, either dye type ink or pigment type ink is good as ink to spray to the recording chart by the ink jet printer.

Either uncoated or coated paper is good as proofreading paper in the present invention, as long as said paper has compatibility with the ink jet recordings. However, coated paper having one or more ink-receiving layers containing a porous pigment on the top of a support is preferable in consideration of ink absorbency, the color reproduction region, the color difference and the difference of gloss as compared with regular printing paper, and said paper will be described in detail below.

Proofreading paper for use in the present invention contains a porous pigment in its ink-receiving layer. The examples of porous pigment for use herein are synthetic silica (colloidal silica, wet process amorphous silica, gas phase process amorphous silica), alumina (gas phase process alumina, γ alumina) or alumina hydrate (alumina sol, colloidal alumina, cationic aluminum oxide or its hydrates, pseudo-boehmite and the like) in the shape of ultrafine primary particles or secondary particles made by agglutinating said primary particles with a particle size of 0.01 μm to 20 μm and becoming porous with a great many air spaces that are formed among the primary particles when the coated layer is provided. These pigments can be used in combination of more than one kind.

In the coated layer containing the porous pigment for use in proofreading paper of the present invention, other inorganic or organic ultrafine particles may as well be mixed at a ratio of 40 parts or less to 100 parts of the porous pigment. Furthermore, a binder is preferably contained.

Conventionally known various different pigments can be used as said inorganic or organic ultrafine particles. Their examples are white inorganic pigments such as light calcium carbonate, heavy calcium carbonate, magnesium carbonate, kaolin, talc, calcium sulfate, barium sulfate, titanium dioxide, zinc oxide, zinc sulfide, zinc carbonate, satin white, aluminum silicate, diatomaceous earth, calcium silicate, magnesium silicate, aluminum hydroxide, lithopone, zeolite, hydrated halloysite, magnesium hydroxide and the like; and organic pigments such as styrene-based plastic pigment, acrylic plastic pigment, polyethylene, microcapsule, urea resin, melamine resin and the like.

The examples of binder are starch derivatives such as oxidized starch, etherifed starch, phosphate esterified starch and the like; cellulose derivatives such as carboxymethyl cellulose, hydroxyethyl cellulose and the like; casein, gelatin, soybean albumin and polyvinyl alcohol or its derivatives; conjugated diene-based copolymer latex such as polyvinyl pyrrolidone, maleic anhydride resin, styrene-butadiene copolymer, methyl methacrylate-butadiene copolymer and the like; acrylic polymer latex such as acrylic polymer, for example, acrylate or methacrylate polymer or copolymer; vinyl-based polymer latex such as ethylene-vinyl acetate copolymer; or functional group modified polymer latex containing a monomer having a functional group such as carboxyl group of those various polymers; aqueous adhesive such as thermosetting synthetic resin, for example, melamine resin, urea resin and the like; acrylate or methacrylate polymer or copolymer resin such as polymethyl methacrylate; and synthetic resin-based adhesive such as polyurethane resin, unsaturated polyester resin, vinyl chloride-vinyl acetate copolymer, polyvinyl butyral, alkyd resin and the like.

The binder is mixed in an amount of 3 to 70 parts by weight, preferably 5 to 50 parts by weight per 100 parts by weight of the porous pigments and, if necessary, other pigments in total. If it is in an amount of less than 3 parts by weight, the ink-receiving layer has the insufficient strength of coat, and if it is in amount exceeding 70 parts by weigh, ink absorbency is deteriorated.

Furthermore, the ink-receiving layer can suitably be mixed with additives such as dye fixing agent, pigment dispersant, thickening agent, fluidity improver, antifoaming agent, foam inhibitor, release agent, foaming agent, penetrant, fluorescent brightener, ultraviolet absorber, antioxidant, antiseptic, fungistat, waterproofing agent, wet strength agent, dry strength agent and the like, besides the coloring agents as described later.

Particularly, it is preferable to mix a cationic dye bonding agent comprising secondary amine, tertiary amine, quaternary ammonium salt or the like capable of forming insoluble salt with a sulfone group, carboxyl group, amino group or the like contained in water-soluble direct dyes or water-soluble acid dyes that is the dye content of aqueous ink, enabling the ink-receiving layers to capture dyes with the result that coloring properties are improved and that dropping of water due to the formation of insoluble salt and running or staining of ink due to the moisture uptake can be inhibited.

Proofreading paper of the present invention can be prepared in a way the ink-receiving layer is consisted of more than one layer, having a gloss-providing layer on the surface.

Either on-machine coating or off-machine coating method can prepare the ink-receiving layer or gloss-providing layer of proofreading paper of the present invention. For example, various conventionally known equipment such as air knife coater, curtain coater, die coater, blade coater, gate roll coater, bar coater, rod coater, roll coater, billblade coater, short dwell blade coater, size press and the like can be used on machine or off machine. After the coating, the finish stroke is given by using calender equipment such as machine calender, TG calender, super calender, soft calender or the like, as described later.

The amount of coating is not particularly limited in the ink-receiving layer of proofreading paper of the present invention, but the amount of 1 to 30 $g/m^2$ is preferable. It is undesirable to coat in an amount of more than 30 $g/m^2$ lest curling properties of the sheets should be deteriorated. Furthermore, the ink-receiving layer can be coated in several bouts by dividing a predetermined amount of coating.

The support of proofreading paper for use in the present invention is base paper made by various equipment such as Fourdrinier paper machine, cylinder mold paper machine, twin wire paper machine or the like from chemical pulp such as LBKP, NBKP and the like; mechanical pulp such as GP, PGW, RMP, TMP, CTMP, CMP, CGP and the like; and wood pulp such as waste paper pulp, for instance, DIP and the like and the conventionally known pigments as chief components, mixed with one kind or more of various additives such as binder and sizing agent, fixing agent, yield improver, cation making agent, paper strength agent and the like, and furthermore this base paper includes base paper having a size press or anchoring layer comprising starch, polyvinyl alcohol and the like. It is good to provide such base paper with a coat as it is or treat base paper on calender equipment such as machine calender, TG calender, soft calender and the like for the purpose of making it even.

Furthermore, the basis weight of proofreading paper is preferably selected in a way it is in a range of the basis weight of regular printing paper intended for use, minus 10% to plus 50%. This is because aqueous ink is used in a great deal of ink jet recording and the recording chart is obliged to contain a great deal of ink solvent because of the images recorded in aqueous ink, with the result that recorded proofreading paper is cockling, giving an impression that it is different from regular printed matter recorded in oily ink. Therefore, it is preferable that proofreading paper has the basis weight with a little difference from that of regular printing paper or rather is a little at the thicker side. It is possible to coat a back coat layer on the opposite surface of the ink-receiving layer interposing the support in-between in order to provide suitable curling properties, and as the pigment to be used for this purpose a pigment in the shape of flat bars or hydrated halloysite is preferred.

The present invention also includes an embodiment of proofreading paper having the ink-receiving layers on both the surfaces. In this case, preferably, if regular printing paper intended for use is identically made up on both the surfaces, proofreading paper is made up in the same way, and if each surface is made up in each own way, each surface of proofreading paper is made up to match each corresponding surface. In this way, both the surfaces of proofreading paper can be used in the application of proofreading, providing the advantages that proofreading paper can save money economically, is made up in a way similar to the constitution of true regular printed matters and feels a touch or the like resembling the touch or the like of regular printed matters.

The color difference as used herein is the result of calculating the color difference ($\Delta E^*$) as provided for by JIS-Z8730 between regular printing paper and proofreading paper on the basis of the values obtained by measuring the lightness index ($L^*$) and perceived chromaticity index ($a^*$, $b^*$) as provided for by JIS-Z8729. Specifically, the measurements are performed on the condition of D-n P (see 6.3.2 of JIS-Z8722) and using the standard source D65 as the light source.

Proofreading paper for use herein is made to have the color difference ($\Delta E^*$) in a range of $\Delta E^* \leq 2$ as compared with regular printing paper by adding various coloring agents to at least either support or ink-receiving layer of proofreading paper. Particularly, if the coloring agents are incorporated into the ink-receiving layer, the lightness and chromaticity of color can easily be controlled, making the effects of the present invention even better.

Furthermore, both the dye-based coloring agents and pigment-based coloring agents can be used as the coloring agents in the present invention, but it is particularly preferable to use the pigment-based coloring agents from the viewpoint of shelf stability of color tone.

The examples of the coloring agent to be added are the dye-based coloring agents such as the azo compounds (dithizone, formazane), quinone-based (naphthoquinone, anthraquinone, acridone, anthoanthrone, indanthrene, pyrenedione, violanthrone), quinoneimine (azine, oxazine, thiazine), indigo dyes (indirubin, oxindigo, thioindigo), sulfur dyes, diphenylmethane, triphenylmethane (fluoran, fluoresein, Rhodamine), ferrocene, fluorenone, fulgide, perylene, fluphenazine, phenothiazine, polyene (carotene, maleic acid derivatives, pyrazolone, stilbene, stylyl), polymethine (cyanine, pyridinium, pyrylium, quinolinium, rhodanine), xanthene, alizarin, acridine, acridinone, carbostyril, coumarin, diphenylamine, quinacridone, quinophthalone, phenoxazine, phthaloperinone, porphin, chlorophyll, phthalocyanine, crown compounds, squarilium, thiafulvalene, thiazole, nitro dyes, nitroso dyes, post-developing leuco dyes and the like; or pigment-based coloring agents such as titanium black, titanium yellow, ultramarine, Prussian blue, cobalt blue, carbon black, iron black, zinc oxide, cobalt oxide, silicon oxide, aluminum hydroxide, azo pigments, phthalocyanine pigments, color lake, starch, urea-formalin resin, synthetic resin particles including melamine resin, silicon particles and the like; and fluorescent dyes such as stilbene-based, distilbene-based, benzoxazole-based, coumarin-based, imidazole-based, benzoimidazole-based, pyrazoline-based and the like, but the present invention is not limited to them.

The lightness and chromaticity of these coloring agents can be suitably adjusted by using them in combination with white pigments such as diatomaceous earth, clay, calcined clay, talc, kaolin, calcined kaolin, calcium carbonate, magnesium carbonate, titanium dioxide, titanium dioxide-coated mica, barium sulfate, molybdenum white, zinc oxide, lithopone, zinc sulfide, gypsum, white lead and the like.

These coloring agents can be used singly or in combination of two kinds or more. Furthermore, the dyes and pigments are suitably mixed each other at whatever ratios unless the color shading occurs.

The coloring agents can be used in whatever concentration if the desired color shade is obtained, but ordinarily they are used in a concentration of 0.001 to 1% by weight to pulp when they are added into the support and in a concentration of 0.001% to 1% to the weight of the total solid content of the ink-receiving layer when they are added thereto.

Besides the color difference from regular printing paper, proofreading paper for use herein has a difference of 75° specular gloss in the absolute value |ΔGs| of 15% or less as compared with regular printing paper in conformity with the provisions of JIS-P8142.

If the |ΔGs| is more than 15%, proofreading paper feels different from regular printed matters and is unsuitable for use in proofreading.

Ordinarily, proofreading paper is made to be glossy with a treatment for smoothing the surface of coat by passing it between the rolls with the application of pressure on processing equipment such as machine calender, TG calender, soft calender, super calender, gloss calender and the like. Alternatively, the wet coat is contact-bonded to the side of a heating drum having a specular surface, and thereafter the coat is dried and released from the drum, along with a copy of said specular surface, and this is called a casting treatment effective for glossing. It does not matter whether either of said glossing treatments or further any known glossing treatment other than them are used in the present invention, as long as the 75° specular gloss of proofreading paper hereof has the difference in a range of ±15% from that of regular printing paper intended for use.

DESCRIPTION OF PREFERRED EMBODIMENT

As regular printing paper, coated paper "ofurin pearl coat L (sheet-fed press type)" (web offset paper) made by Mitsubishi Paper Mills, Ltd. (having a basis weight of 81.4 g/m$^2$) was used herein. This regular printing paper was found to have L*, a* and b* respectively of 94.10, 1.19 and 2.17 and 75° specular gloss of 67.6%.

The method for preparing proofreading paper as used herein will be described below. The word parts and % as used herein mean parts by weight and % by weight respectively unless otherwise specified. Meanwhile, the color difference between proofreading paper and regular printing paper was a color difference (ΔE*) as provided for by JIS-Z8730 that was calculated from the values obtained by measuring the lightness index (L*) and perceived chromaticity index (a*, b*) as provided for by JIS-Z8729 with a colorimeter-cum-color difference meter CR-200 made by Minolta Camera Co., Ltd. and measuring the color of images in a regular printed matter and a proof sheet with a calorimeter DTP-51 made by X-Rite. Furthermore, the 75° specular gloss was measured with an angle-bending photometer VGS-1001DP made by Nihon Denshoku Kogyo Co., Ltd. in conformity with the provisions of JIS-P8142.

<Preparation of Proofreading Paper A>

A coating solution for ink-receiving layer was prepared from 50 parts of synthetic amorphous silica having a BET specific surface area of 270 m$^2$/g (Fine Seal X-37B made by Tokuyama Soda Co., Ltd.), 30 parts of alumina sol (Alumina Sol-520 made by Nissan Chemical Industries, Ltd.), 30 parts of polyvinyl alcohol (PVA 117 made by KURARAY CO., LTD.), 20 parts of a cationic dyes bonding agent (Sumireds Resin 1001 made by SUMITOMO CHEMICAL CO., LTD.), 0.0016 part of a yellow fluorescent dyes coloring agent (NL Yellow HN-L made by DAINICHISEIKA COLOUR & CHEMICALS MFG. CO., LTD.), 0.005 part of a blue dyes coloring agent (Blue B made by NIPPON KAYAKU K.K.) and 0.018 part of a purple dyes coloring agent (TB1548 made by DAINICHISEIKA COLOUR & CHEMICALS MFG. CO., LTD.). This solution was coated in terms of a dry single spread of 10 g/m$^2$ on both the surfaces of coated base paper having a basis weight of 60 g/m$^2$ by using an air-knife coater and then the solution was dried. Thereafter, a super calender under linear pressure of 190 kg/cm treated base paper, and in this way, proofreading paper A was prepared. It was found that proofreading paper A had a basis weight of 80.3 g/m$^2$ and a 75° specular gloss of 70.5%. The L*, a* and b* were found to be 94.90, 1.40 and 1.88 respectively. It was also found that there were the color difference ΔE* of 0.88, the gloss difference in absolute value |ΔGs| of 2.9 and the basis weight difference of −1.35% between proofreading paper and regular printing paper.

<Preparation of Proofreading Paper B>

Proofreading paper B was prepared by following the procedure for preparing proofreading paper A, except that the yellow fluorescent dye coloring agent was not added and that the blue dye coloring agent and purple dye coloring agent were added respectively at a ratio of 0.008 part and 0.012 part. It was found that proofreading paper B had a basis weight of 79.8 g/m$^2$ and a 75° specular gloss of 66.3%. The L*, a* and b* were found to be 95.17, 0.99 and 0.72 respectively. It was also found that there were the color difference ΔE* of 1.81, the gloss difference in the absolute value |ΔGS| of 1.3 and the basis weight difference of −1.97% between proofreading paper and regular printing paper.

<Preparation of Proofreading Paper C>

Proofreading paper C was prepared by following the procedure for preparing proofreading paper A, except that the yellow fluorescent dye coloring agent, blue dye coloring agent and purple dye color agent were added respectively at a ratio of 0.0028 part, 0.01 part and 0.024 part. It was found that proofreading paper C had a basis weight of 80.2 g/m$^2$ and a 75° specular gloss of 53.7%. The L*, a* and b* were found to be 94.89, 1.09 and 2.35 respectively. It was also found that there were the color difference ΔE* of 0.82, the gloss difference in the absolute value |ΔGs| of 13.9 and the basis weight difference of −1.47% between proofreading paper and regular printing paper.

<Preparation of Proofreading Paper D>

Proofreading paper D was prepared by following the procedure for preparing proofreading paper A, except that the yellow fluorescent dye coloring agent, blue dye coloring agent and purple dye color agent were added respectively at a ratio of 0.0028 part, 0.01 part and 0.024 part. It was found that proofreading paper D had a basis weight of 115.0 g/m$^2$ and a 75° specular gloss of 66.9%. The L*, a* and b* were found to be 93.02, 1.01 and 2.40 respectively. It was also found that there were the color difference ΔE* of 1.12, the gloss difference in the absolute value |ΔGs| of 0.7 and the basis weight difference of 41.3% between proofreading paper and regular printing paper.

<Preparation of Proofreading Paper E>

Proofreading paper E was prepared by following the procedure for preparing proofreading paper A, except that any of the yellow fluorescent dye coloring agent, blue dye coloring agent and purple dye color agent were not added. It was found that proofreading paper E had a basis weight of 80.0 g/m$^2$ and a 75° specular gloss of 65.7%. The L*, a* and b* were found to be 94.43, 1.66 and −0.77 respectively. It was also found that there were the color difference ΔE* of 3.00, the gloss difference in the absolute value |ΔGs| of 1.9 and the basis weight difference of −1.72% between proofreading paper and regular printing paper.

The general purpose computer used herein was a Power Macintosh 9500/132 made by Apple Computer, Inc., with an auxiliary memory of 2 GB (Giga bytes) and a RAM (Random Access Memory) expanded to be 224 MB (Mega bytes).

The RIP used herein was a Brisque made by SCITEX, converting the digital data prepared by the general purpose computer into the TIFF (Tagged Image File Format) data and making their ink jet recording with an ink jet printer. It was desirable to have the resolution of more than 200 dpi (Dots Per Inch) for the TIFF data, and furthermore in order to have the better reproduction of agate or the details of image, the resolution of 300 dpi was put to use. The TIFF data if in the size of Kikuzen print (1,200 mm×720 mm) have the capacity exceeding 300 MB, taking long to transfer them, and therefore after the data were converted into the TIFF, the resultant data were compressed.

A SDP-FHN 175 planographic print with a film base support made by Mitsubishi Paper Mills Co., Ltd. and a Dolev 800 V planographic print output unit made by Scitex were used herein, working under the conditions of 175 lines and output resolution of 3048 dpi. A P-960R automatic developing device made by Mitsubishi Paper Mills Co., Ltd. was used. A SLM-AC developing solution and a SLM-ST III stabilizing solution made by Mitsubishi Paper Mills Co., Ltd. were respectively used on the conditions of the developing time of 20 seconds and the developing temperature of 30° C.

The printings were implemented with a Dia 3H model 4-color printer made by Mitsubishi Heavy Industries, Ltd., capable of printing on paper having the size of Kikuzenhan. Since the printings were implemented with the use of planographic print having the film base support herein, a QM III (Quick Mount) system made by Mitsubishi Paper Mills Co., Ltd. were used in consideration of the improvement of registration precision and operability of print in equipment.

Gios-G brand printing ink of S type made by Dainippon Ink & Chemicals, Inc. was used herein. Furthermore, it was desirable to control the solid concentration of ink in each color of C, M and Y on regular printed matters to stabilize their quality and thus the printings were implemented herein in a way the prints had the solid concentration of ink in each color of C, M and Y as provided for by Japan Color and ISO 12647 established by the Japan Committee of ISO/TC130 (International Organization for Standardization, Printing Technique Committee).

At the step of proofreading the digital data as they were prepared page by page herein, a BJF 8500 ink jet printer of Canon make capable of making the records in the size of A3-nobi (329 mm×420 mm) in six colors was used. Furthermore, a PM-9000 ink jet printer of EPSON make capable of making the records having a size of 1118 mm in width in six colors was used at the proofreading step immediately before the planographic prints were outputted by using the digital data in original dimension that were subjected to layout to page imposition in the size of Kikuzen with the Facilis page imposition software of Mitsubishi Paper Mills Co., Ltd.

Proofreading paper A, B, C, D and E prepared herein were respectively recorded by said BJF 8500 ink jet printer of Canon make and PM-9000 ink jet printer of EPSON make, and the outward appearance of those records was evaluated by comparing them with the regular printed matters. The evaluation of outward appearance was implemented integrally on the basis of tint, hand and drape and impression of gloss.

As a result of evaluating the outward appearance, it was found that, with proofreading paper A, B, C and D mimicking regular printing paper in the color tone, gloss and feeling of touch, the proof sheets were excellent, having an integrally good likeness to the regular printed matters in terms of the tint, hand and drape and gloss. With proofreading paper E without the addition of coloring agents, the proof sheets were found to give an overall impression that they were different from the regular printed matters, and particularly on the highlight portions much affected by the ground color of paper, the tint and hand and drape were different.

It was found as a result of comparison that the proof sheets using said proofreading paper had a good likeness to the regular printed matters in the shade of white ground and therefore that the color reproduction from the white ground to the region having a low concentration of images in the regular printed matters was practically consistent with the color reproduction from the white ground to the region having a low concentration of images in the proof sheets using said proofreading paper. Furthermore, the paper's ground color of the proof sheets was printed and was compared with the conventional DDCP proof sheets having a narrow color reproduction region, with a resultant finding that the proof sheets using proof-reading paper A, B, C and D prepared herein had almost as good quality as the regular printed matters, minimizing the ink stains, reproducing the details beautifully and including all the color regions reproducible by printing. Furthermore, the proof sheets having no difference from the regular printed matters in getting rid of the wrong conversion of characters and double procedure of trapping processing were made feasible by processing the bit data with only one RIP unit and providing the planographic print and proof sheets on the basis of the so processed data.

Next, preparing the TIFF data for ink jet printer output with the RIP herein, they were outputted by the SRjet model ink jet printer of SILVER SEIKO make using the Photoshop image edit software of Adobe make. At this step, the ink jet recording was made after the regular printed matters were compared with the proof sheets using proof-reading paper prepared herein and the difference of color reproduction regions was compensated between the two. For the purpose of comparison, the TIFF data without compensating the difference of color reproduction regions were recorded on paper for ink jet that had been recommended by SILVER SEIKO, and then the so obtained record and the regular printed matter were compared one another for the color reproduction region.

The profile of compensating the difference between the color reproduction regions was that a color chart consisting of 239 color chips as the Colorgenic supplement made by TOYO INK MFG. CO., LTD. was printed by the Dia 3H model printer of Mitsubishi Heavy Industries make and recorded by the SR-jet model ink jet printer of SILVER SEIKO make as provided for by Japan Color and ISO12647 and that the colors of each of them were measured by the DTP-51 model calorimeter of X-Rite make and that the results of this measurement were served as the basis of compensation. The color measurement was conducted in due consideration of the deterioration of concentration or the changes of color shade with elapse of time, and thus the regular printed matters were tested more than 3 hours after printing and the proof sheets outputted by the ink jet printer were tested more than 24 hours after printing by taking the drying-induced deterioration of concentration into account.

Figure 4:
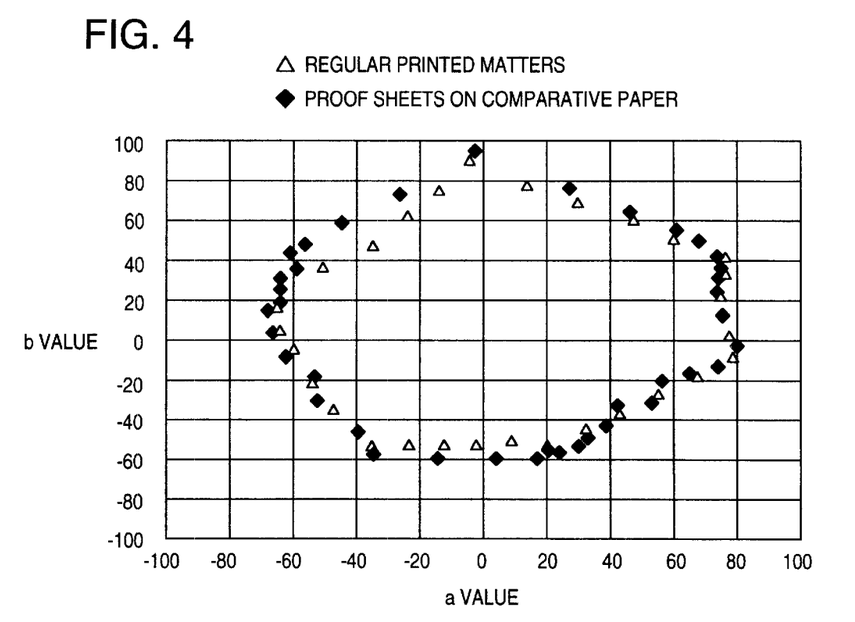
FIG. 4 is a graph illustrating the color reproduction regions of a proof sheet on comparative paper and a regular printed matter.
Figure 5:
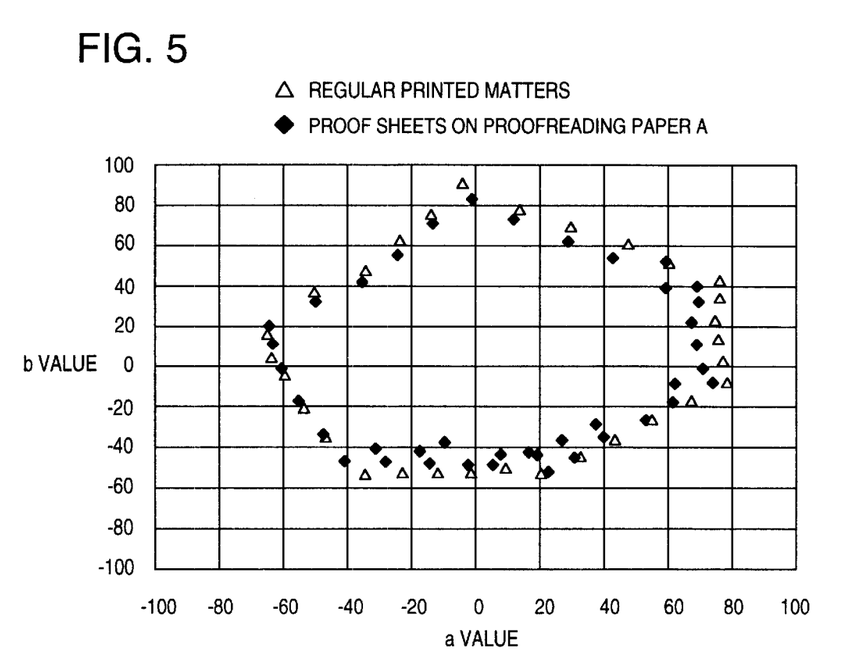
FIG. 5 is a graph illustrating the color reproduction regions of a proof sheet on proofreading paper A and a regular printed matter.

FIG. 4 is a graph comparing the regular printed matters with a comparative sample recorded by the SR-jet model ink jet printer of SILVER SEIKO make on paper for ink jet that was recommended by SILVER SEIKO and the comparative sample is found to have a tint on the red-bluish side, but on the contrary, the sample recorded on proofreading paper A prepared herein with the compensation of the difference of color reproduction regions is found to be a good proof sheet having little difference from the regular printed matters in the color reproduction region, as illustrated in FIG. 5.

Figure 6:
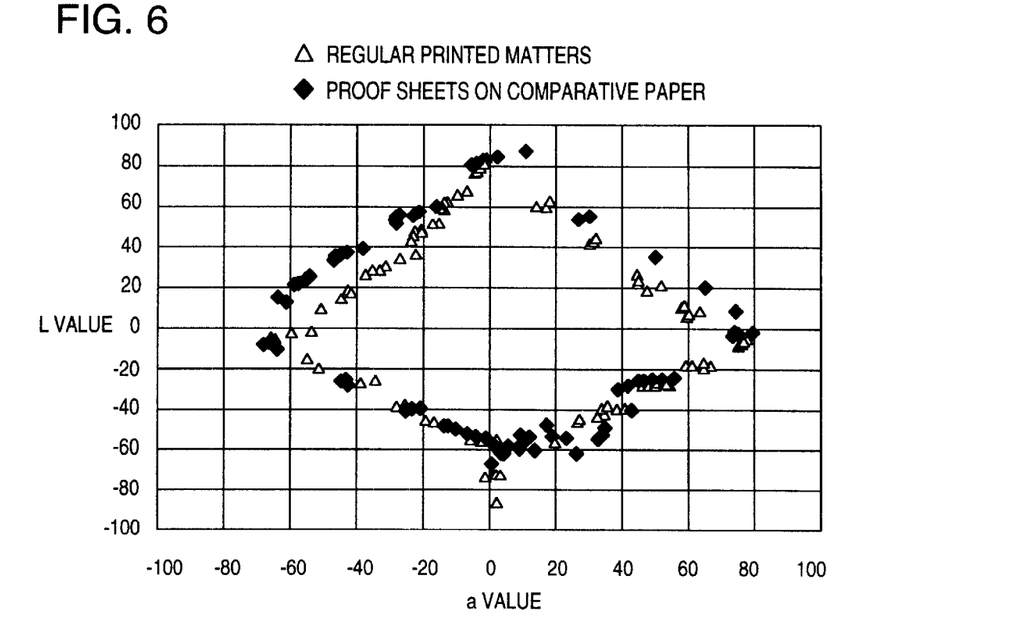
FIG. 6 is a graph illustrating the color reproduction regions of a proof sheet on comparative paper and a regular printed matter.
Figure 7:
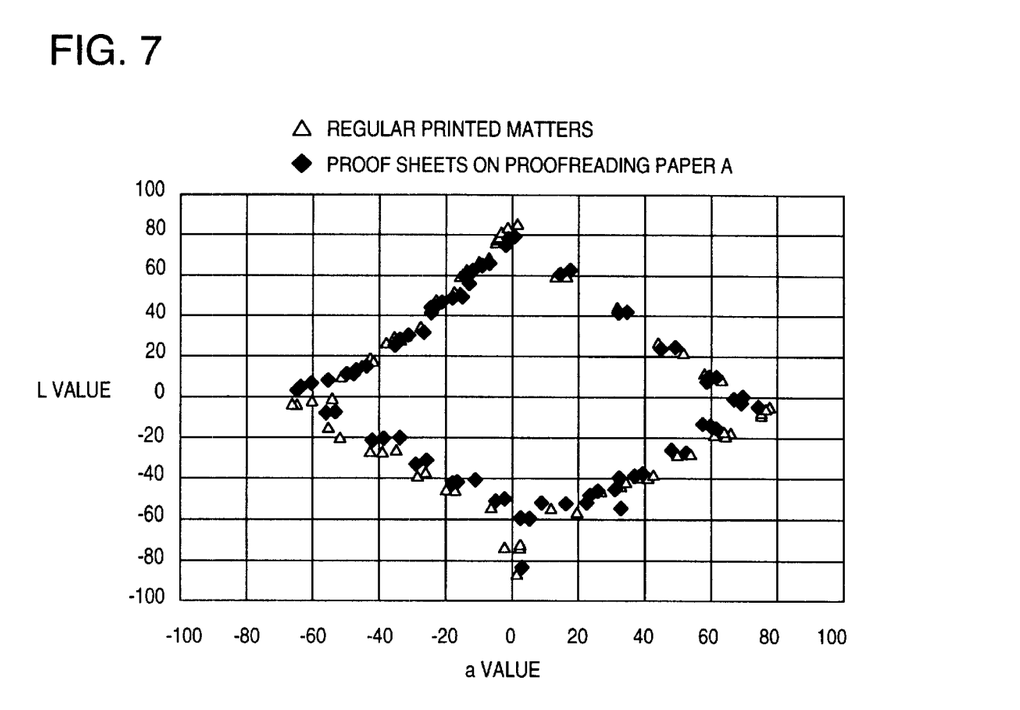
FIG. 7 is a graph illustrating the color reproduction regions of a proof sheet on proofreading paper A and a regular printed matter.
Figure 8:
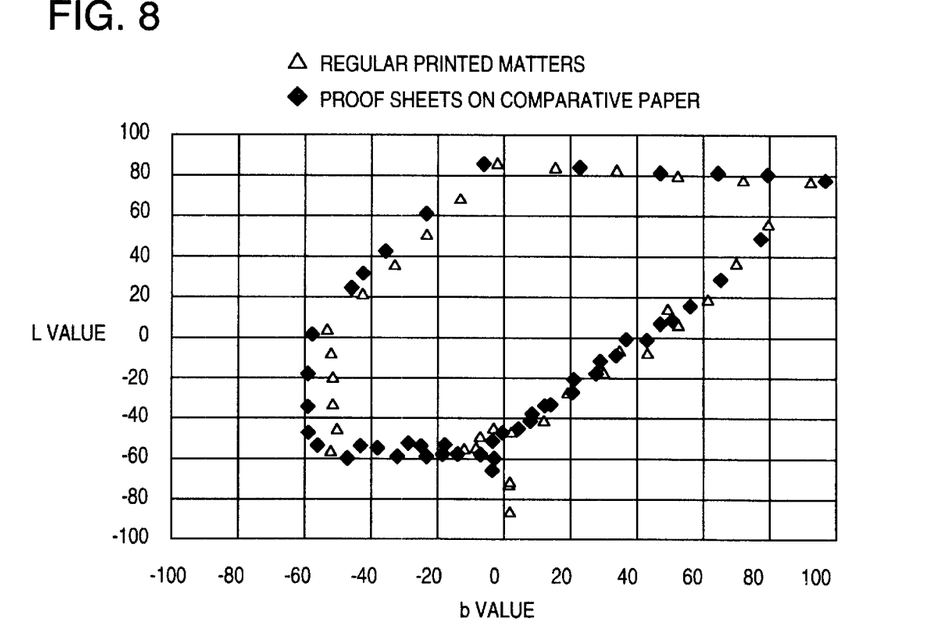
FIG. 8 is a graph illustrating the color reproduction regions of a proof sheet on comparative paper and a regular printed matter.
Figure 9:
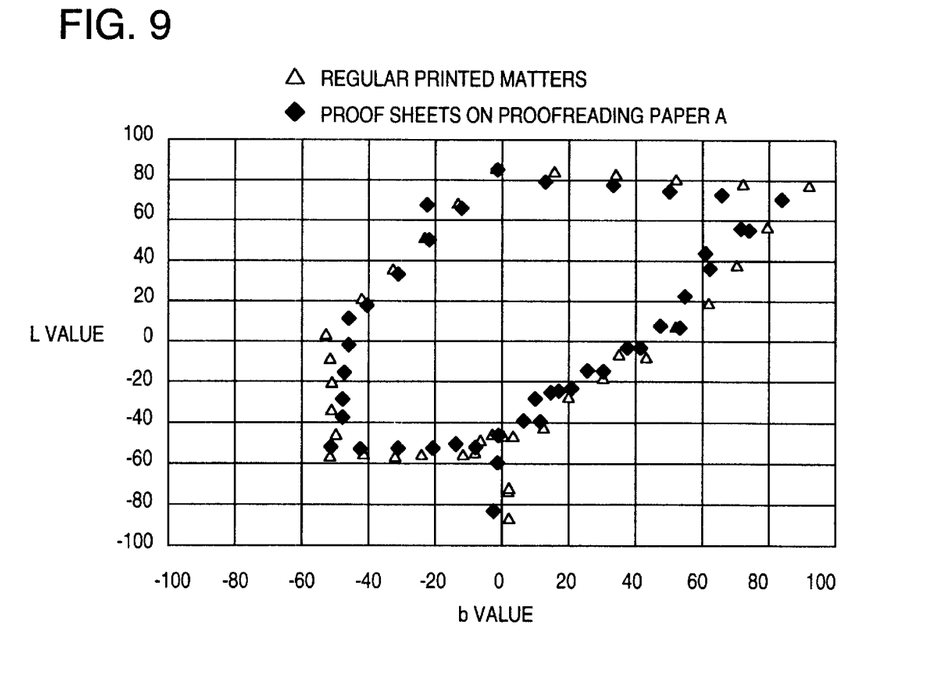
FIG. 9 is a graph illustrating the color reproduction regions of a proof sheet on proofreading paper A and a regular printed matter.

FIG. 6 and FIG. 8 are graphs comparing the color reproduction region of the regular printed matters with that of the comparative sample recorded on paper recommended for SR-jet, while FIG. 7 and FIG. 9 are graphs comparing the color reproduction region of the regular printed matters with that of the sample recorded on proof-reading paper A prepared herein with compensating the difference of the color reproduction regions. FIG. 6 and FIG. 8 show that the comparative sample recorded on recommended paper is different from the regular printed matters in the color reproduction region, while FIG. 7 and FIG. 9 show that the sample recorded on proofreading paper prepared herein with compensating the difference of the color reproduction regions is little different from the regular printed matters in the color reproduction region, and whereas there is the color difference $\Delta E^*$ of 14.4 between the regular printed matters and the comparative sample recorded on recommended paper, the color difference $\Delta E^*$ is 3.8 between the regular printed matters and the sample recorded on proofreading paper A prepared herein with compensating the difference of the color reproduction regions, and in this way an excellent proof sheet having little color difference from the regular printed matters is obtained.

Furthermore, with the use of BJF 8500 of Canon make, the digital data could be proofread at the step of laying their design out page by page, resulting in the efficient operations with the capability of beginning with proofreading in the initial stages of the digital prepress process.

As described above, the present invention makes it possible to provide a digital prepress system capable of preparing at a low cost economically an excellent proof sheet practically free from wrong conversion of characters and double procedure of trapping processing, containing the color reproduction region having a close likeness to printing with the result that there is little color difference of images between the proof sheets and the regular printed matters and imparting no impression that proofreading paper is different from the regular printing paper in the color tone, gloss, touch and the like.

What is claimed is:

1. A digital prepress system, comprising:
   a Raster image processor for processing digital data into processed data;
   a planographic print output unit and an ink jet printer respectively receiving said processed data and correspondingly produce a planographic print and a proof sheet;
   said ink jet printer comprising a preparing means for preparing said proof sheet with ink jet recording on a proofreading paper;
   wherein said proofreading paper has a color difference of 2 or less and a gloss difference of 75° specular gloss in an absolute value of 15 or less as compared with regular printing paper.

2. The prepress system according to claim 1, wherein the ink jet recording is made by compensating any difference of color reproduction regions between a regular printed matter and a proof sheet using said proofreading paper.

3. The prepress system according to claim 1, wherein the basis weight of said proofreading paper varies from that of regular printing paper by a range between −10% to +50%.

4. The prepress system according to claim 3, wherein said proofreading paper comprises at least one ink-receiving layers containing a porous pigment on a support.

5. The prepress system according to claim 4, wherein said ink jet printer records in ink comprising at least 6 colors.

6. The prepress system according to claim 3, wherein said ink jet printer records in ink comprising at least 6 colors.

7. The prepress system according to claim 1, wherein said proofreading paper comprises at least one ink-receiving layers containing a porous pigment on a support.

8. The prepress system according to claim 7, wherein said ink jet printer records in ink comprising at least 6 colors.

9. The prepress system according to claim 1, wherein said ink jet printer records in ink comprising at least 6 colors.

* * * * *